(12) United States Patent
Yang

(10) Patent No.: US 6,519,537 B1
(45) Date of Patent: Feb. 11, 2003

(54) APPARATUS PROVIDING ON-LINE INDICATION OF FREQUENCY OF AN AC ELECTRIC POWER SYSTEM

(75) Inventor: Lifeng Yang, Pittsburgh, PA (US)

(73) Assignee: Eaton Corporation, Cleveland, OH (US)

(*) Notice: Subject to any disclaimer, the term of this patent is extended or adjusted under 35 U.S.C. 154(b) by 0 days.

(21) Appl. No.: 09/567,651

(22) Filed: May 9, 2000

(51) Int. Cl.$^7$ ................................................ G01R 21/00
(52) U.S. Cl. ............................ 702/58; 702/58; 702/72; 702/75; 702/106; 324/66; 324/76.11; 323/211; 323/241; 700/20; 700/22
(58) Field of Search .............................. 702/58, 72, 75, 702/106; 361/5–7, 30, 42, 45, 52, 56–60, 76–79, 93.2, 93.4, 111, 209, 244, 381, 601; 324/66, 76.11, 128, 163, 328, 667, 674, 681; 323/211, 241, 274, 276, 284–286, 322; 710/1, 70, 69; 708/6, 8, 102, 271, 290, 309, 401–403, 445, 805, 819–822; 307/2, 3, 22, 27–28; 700/20, 22

(56) References Cited

U.S. PATENT DOCUMENTS

| 5,544,065 A | 8/1996 | Engel et al. |
| 5,559,719 A | 9/1996 | Johnson et al. |
| 6,104,968 A | * 8/2000 | Ananth ........................ 700/297 |

OTHER PUBLICATIONS

Astronomical Data Analysis Software and Systems VII, ASP Conference Series, vol. 145, 1998, Albrecht et al. p. 2, paragraph 2.*
M. Begovic et al. "Frequency Tracking in Power Networks in the Presence of Harmonics", *IEEE Transactions on Power Delivery*, Vol. 8, No. 2, Apr. 1993, pp. 480–486.
D. Member et al., "A New Frequency Tracking and Phasor Estimation Algorithm for Generator Protection", 96 SM 376–5 PWR, A paper recommended and approved by the IEEE Power System Relaying Committee of the IEEE Power Engineering Society for presentation at the 1996 IEEE/PES Summer Meeting; 7/28–8/1/96, pp. 1–7.
T.S. Sidhu et al., "An Iterative Technique for Fast and Accurate Measurement of Power System Frequency", PE–778–PWRD–0–04–1997, A paper recommended and approved by the IEEE Power System Relaying Committee of the IEEE Power Engineering Society for publication in the IEEE Transactions on Power eliver. Feb. 13, 1996, pp. 1–7.
P.J. Moore et al., "Frequency Relaying Based on Instantaneous Frequency Measurement", University of Bath, School of Electronic and Electrical Engineering, pp. 1–6.
A G. Phadke et al., "A New Measurement Technique for Tracking Voltage Phasors, Local System Frequency, and Rate of Change of Frequency", *IEEE Transactions on Power Apparatus and Systems*, vol. PAS–102, No. 5, May 1983, pp. 1025–1038.

* cited by examiner

*Primary Examiner*—Marc S. Hoff
*Assistant Examiner*—Elias Desta
(74) *Attorney, Agent, or Firm*—Martin J. Moran

(57) ABSTRACT

Apparatus for determining the frequency of an ac power signal, includes sensing circuitry to sense the ac signal. In a digital implementation of the invention, a double average of the samples is generated by a processor as the sum of the most recent sample, twice the next most recent sample plus the third most recent sample. The least mean square of a running window of the most recent double average signals is generated to avoid discontinuities at the zero crossings and to reduce the effects of noise. The frequency is determined from this least mean square value of the window of double average signals. As implemented in a protective relay, a trip signal is generated if the frequency is out of limits.

15 Claims, 2 Drawing Sheets

APPARATUS PROVIDING ON-LINE INDICATION OF FREQUENCY OF AN AC ELECTRIC POWER SYSTEM

BACKGROUND OF THE INVENTION

1. Field of the Invention

This invention relates to apparatus for monitoring and protecting ac electric power systems, and particularly to apparatus which provides an on-line measurement of frequency of waveforms in the ac electric power system.

2. Background Information

Frequency estimation is a very important function in power system protection. The frequency is not only an indication of power quality, but is also employed as a criterion for taking certain system control actions, such as load shedding. In addition, many protection functions and settings are based on the nominal frequency. In reality, power system frequency changes from time to time around the nominal value. Even through the variation from the nominal value is often very small, it may still make a significant difference in the frequency-related applications. For instance, the voltage and current phasors, which are essential to implement many metering and relay functions, are obtained based on the nominal power frequency through use of DFT (Discrete Fourier Transform). A deviation from the nominal frequency will result in errors in both magnitude and phase of the phasor, and in turn, these errors will migrate into metering and relaying functions. If an accurate frequency estimation could be obtained, these errors would be minimized or eliminated.

The most popular methods for frequency measurement available today are the zero-crossing and DFT based techniques. As is well known, the accuracy of the zero-crossing method is influenced by harmonics but can be improved by using the least square technique or other noise-suppressing techniques. On the other hand in the DFT based method, whether based on the magnitude or phase angle of a phasor, if all three-phase voltages are not available, the estimated frequency will be oscillatory when the system frequency deviates from the nominal frequency. This oscillatory frequency is double the system frequency. The envelope of the estimated frequency increases with increasing deviation from the nominal frequency. Usually, the oscillatory frequency is smoothed through use of an average filter. However, with such a filter, the estimated frequency becomes stationary only at certain system frequencies while remaining oscillatory for other deviant system frequencies. It can be shown that with an average filter, the envelope of the estimated frequency will be a standing wave of increasing amplitude as the deviation from the nominal frequency increases. The standing points are dependent on the length of the average filter used. For instance, a two-cycle filter will result in three standing points at which the system frequencies are multiples of one-fourth the nominal frequency. This means that the estimation accuracy is system frequency dependent. An accurate frequency is only obtained at the standing points. An accurate estimation over a wide range of frequencies may be achieved by using adaptive approaches. These include the adaptive sampling period, the adaptive length of the data window and adaptive filtering. Unfortunately, all of the adaptive approaches involve a considerable amount of computation in order to achieve better results.

There is a need therefore, for improved apparatus for determining the frequency in an ac electric power system.

There is a further need for such apparatus, which provides such an estimation of frequency with a consistent and predictable accuracy.

There is also a need for such apparatus which does not require excessive calculation, and can therefore, provide an accurate estimation of frequency on-line with a reasonable computational burden and cost.

SUMMARY OF THE INVENTION

These needs and others are satisfied by the invention which is directed to apparatus for providing an accurate on-line indication of frequency in an ac electric power system. The apparatus utilizes a time domain approach and includes processing a sensed waveform in the electric power system to generate what I have identified as a double average. This double average is derived from a few consecutive samples of the waveforn. More particularly, the double average signal is the sum of a most recent value of the waveform, twice the next most recent value of the waveform and the third most recent value of the waveforn. Means process this double average signal to generate a frequency signal. This frequency signal can be used in an analyzer or protective device such as a protective relay or a circuit breaker which interrupts the current in the electrical system. This basic system generates an indeterminate frequency when the next most recent sample has a zero value, i.e. at a zero crossing. Also the accuracy of this basic system is reduced by noise.

To further improve the accuracy of the apparatus, additional means generating a running average of the double average signal is used. Preferably, this additional means provides a least square value of the double average signal, although other noise suppression techniques such as a straight average can also be used.

Preferably, the apparatus includes a digital processor in which case sensing means generates digital samples of the selected waveform in the ac electric power system. The three most recent digital samples are utilized to calculate the current value of the digital double average signal, which is then used by means in the digital processor to generate a digital frequency signal. In protection apparatus such as a protective relay or circuit breaker, the digital frequency signal is compared to limits and means are provided which interrupt current in the electric power system in the event that the digital frequency signal is outside the limits. Again, the digital system includes means for generating a running digital double average signal in a sliding window of time. This running digital double average signal can be implemented by means of applying a least mean square function or a straight average function to a selected number of the most recent digital double average signals.

Therefore, it is an object of the invention to provide improved apparatus for determining the frequency in an ac electric power system. It is a further object of the invention to provide such apparatus which determines the frequency with consistent accuracy without excessive calculations and can do so on-line.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODYMENTS

The invention has application generally to the determination of frequency in an ac power system, and particularly to determining the frequency on-line. It will be described as applied to a protective relay, but it will be apparent to those skilled in the art that it has numerous other applications such as other protective devices including circuit breakers, and network protectors and to analyzers and meters, for instance.

Figure 1:
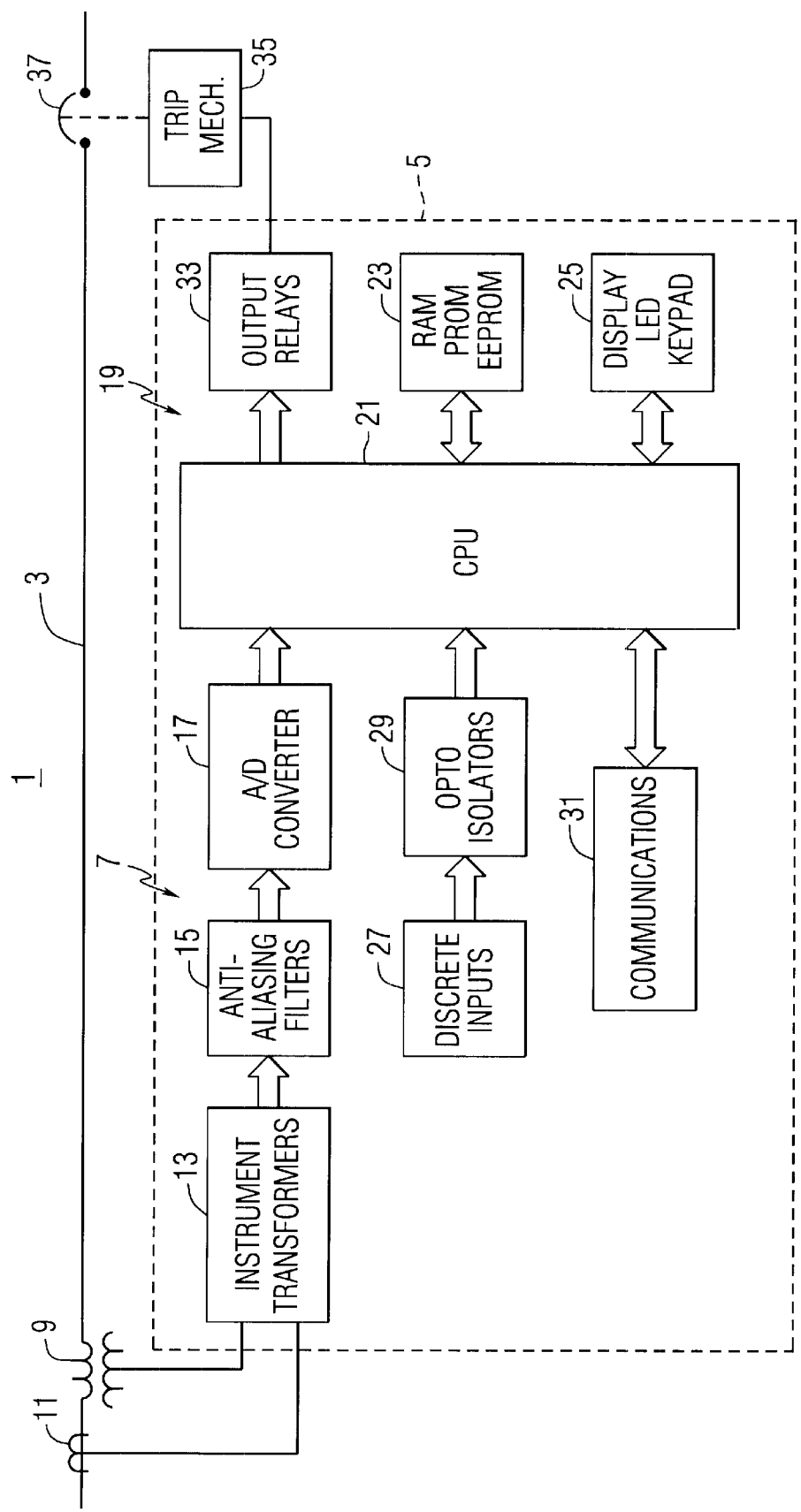
FIG. 1 is a schematic diagram of a protective relay incorporating the invention.
Figure 2:
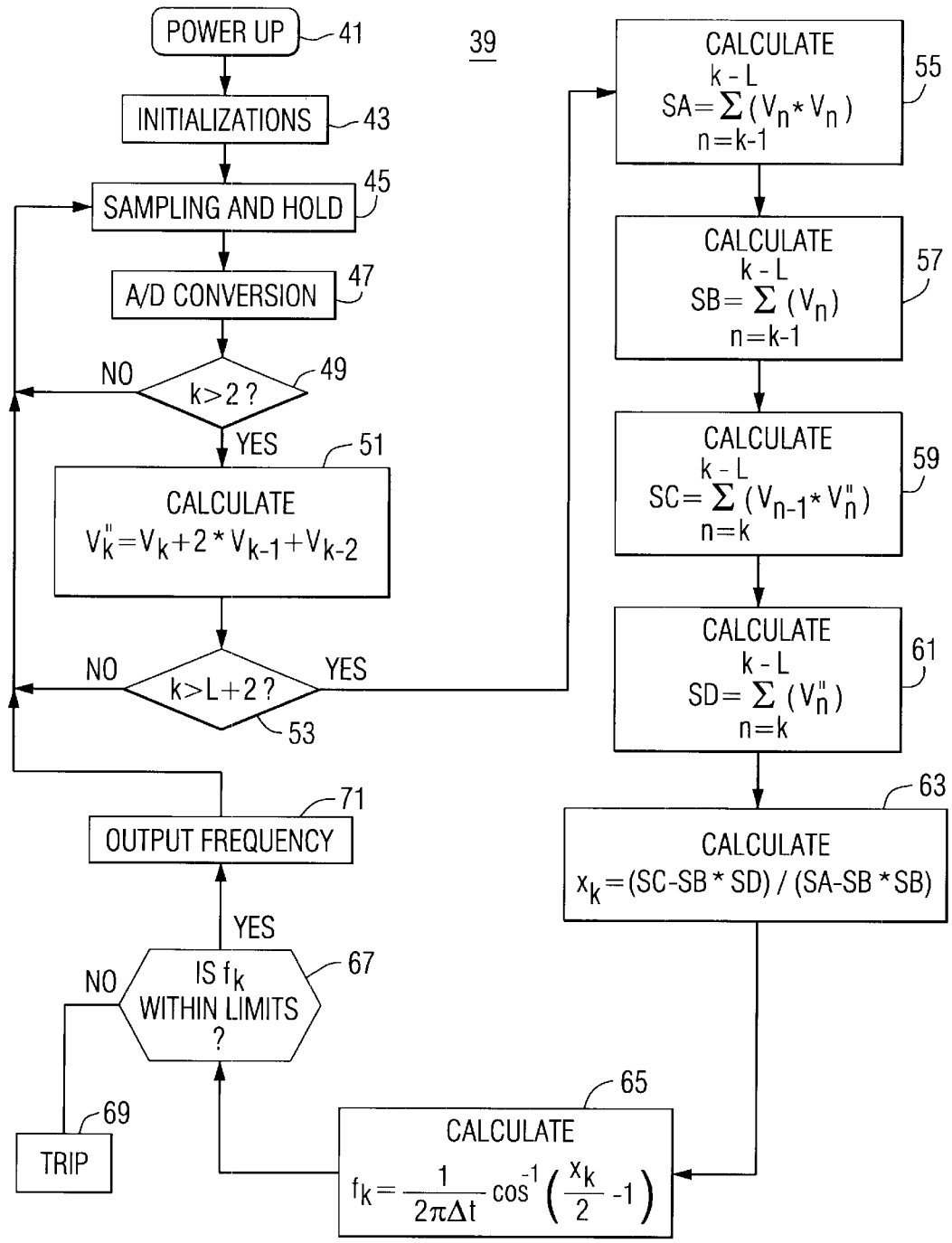
FIG. 2 is a flow chart of the program run by the protective relay of FIG. 1 to implement the invention.

Referring to FIG. 1, the electric power system 1 to which the invention is applied includes a power line 3. While a single line representation of the power line 3 has been used in FIG. 1, the line can be single phase or multiphase such as 3 phase with or without a neutral. The protective relay 5 is a digital relay and includes a sensing circuit 7 for converting analog voltage and current inputs sensed by the potential transformer 9 and current transformer 11 respectively. Instrument transformers 13 reduce the high voltage and current to values that the electronic circuitry can accept and electrically isolate the relay from the power system. Anti-aliasing filters 15 remove unwanted high frequency noise and satisfy the sampling requirement of the analog to digital (A/D) converter 17 which converts the analog signals to digital signals for input to a microprocessor 19 which includes a central processing unit (CPU) 21 and suitable memory 23 such as (RAM, PROM, and EEPROM) which store intermediate variables, program code and setting values. A man-machine interface 25 can include a display device along with a key pad or pushbuttons which provide a means of displaying metering values, to view and set settings, and to display other system data and status. The man-machine interface 25 also can include light emitting diodes (LEDs) which indicate system operation status. Discrete inputs 27 such as for example a remote trip signal, are input to the CPU 21 through optoisolators 29. If desired, communications protocol 31 can be provided for interfacing the protective relay with other devices on a network (not shown).

The protective relay 5 also includes output relays 33 which convey decisions generated within the protective relay based on the inputs and predefined conditions to the devices to be controlled. For instance, a trip relay can actuate a trip mechanism 35 which opens the main contacts 37 to interrupt the current in the power line 3.

The frequency of the ac signal is determined from the voltage of a single phase. A current waveform could also be used for determining frequency; however, generally the voltage signal will be utilized as it will generally be a more stable signal in a voltage sourced power system. In accordance with the invention, the frequency estimation is based on the relationship between the raw samples of the voltage and their double averages. The double average voltage $v_k''$ is calculated using three consecutive raw samples of a single-phase voltage selected from any of the three phase voltage measurements available. Thus:

$$v_k'' = v_k + 2 \cdot v_{k-1} + v_{k-2} \quad \text{Eq. (1)}$$

The double average voltage can be related to the raw sample voltage by $x_k$, $$v_k'' = x_k \cdot v_{k-1} \quad \text{Eq. (2)}$$

Where $$x_k = 4 \cdot \cos^2\left(\frac{\omega_k \cdot \Delta t}{2}\right) \quad \text{Eq. (3)}$$

Then the frequency $f_k$ can be found from $x_k$ $$f_k = \frac{1}{2\pi \Delta t} \cos^{-1}\left(\frac{x_k}{2} - 1\right) \quad \text{Eq. (4)}$$

Once $v_{k-1}$ and $v_k''$ are known and $v_{k-1}$ is not zero, $x_k$ can be determined. However, if $v_{k-1}$ is close to zero, $x_k$ becomes undetermined. In addition, if some degree of noise appears in the voltage signal, an erroneous estimate of $x_k$ will be obtained.

In order to overcome these difficulties, the digital double average is generated from a selected number of most recent values of the digital double average signal. Preferably, the least mean square of a running window of the selected number of most recent values of the digital double average signal is used, although other functions such as the average of the selected number of most recent double average signals can be used.

To apply the least mean square function, assume that the length of the data window is L samples.

$$X_k = (V_k^T V_k)^{-1} V_k^T V_k'' \quad \text{Eq. (5)}$$

Where $$V_k'' = [v_{k-L+1}'' \, v_{k-L+2}'' \, \ldots \, v_{k-1}'' \, v_k'']^T \quad \text{Eq. (6)}$$

$$V_k = \begin{bmatrix} v_{k-L} & v_{k-L+1} & \cdots & v_{k-2} & v_{k-1} \\ 1 & 1 & 1 & 1 & 1 \end{bmatrix}^T \quad \text{Eq. (7)}$$

$$X_k = [x_k \epsilon]^T, \epsilon \text{ is an error.} \quad \text{Eq. (8)}$$

Now $f_k$ can be determined from equation (4).

Several factors are involved in determining the length L of the data window for calculating $x_k$.

To obtain $x_k$ using the Least Square method, 2(L+1) multiplications, (5L-3) additions and one division operations must be performed. As L increases, the operations involved will be linearly increased. The purpose of the Least Square method is to suppress noise. The more samples are used, the better performance will be obtained. However, the performance will not be improved much when the number of samples used reaches a certain level. Typically, if the sampling rate is eight, a full cycle of data may be used; if it is 12 or 16, a half cycle of data would be sufficient; if it is 24 or 32, a quarter cycle of data can be used.

The number of samples being used is also dependent on how often the frequency estimation routine is called (executed). If the data window is continuously shifted, in other words, $x_k$ is calculated every sample, L would be limited to a small number because the number of the operations that the CPU can perform during each sample interval is limited. If the frequency routine is called once a cycle, it is not necessary that the calculations towards $X_k$ be completed within one sample interval. They can be allocated among several sample intervals and therefore, a larger L may be used.

Usually, the rate of change in the power system frequency is slow, even in the power swing case it should be less than a few Hz. Therefore, it is not necessary to update the frequency at every sample. It is adequate to update the frequency once a cycle in most applications. For the most popular sampling rate of 32 per cycle being used in the modem relay system, eight samples of data may be used to obtain $x_k$, with L being six.

Hence, $V''_k$ is calculated as follows:

$$V''_k = \begin{bmatrix} v''_{k-5} \\ v''_{k-4} \\ v''_{k-3} \\ v''_{k-2} \\ v''_{k-1} \\ v''_k \end{bmatrix} = \begin{bmatrix} 1 & 2 & 1 & 0 & 0 & 0 & 0 & 0 \\ 0 & 1 & 2 & 1 & 0 & 0 & 0 & 0 \\ 0 & 0 & 1 & 2 & 1 & 0 & 0 & 0 \\ 0 & 0 & 0 & 1 & 2 & 1 & 0 & 0 \\ 0 & 0 & 0 & 0 & 1 & 2 & 1 & 0 \\ 0 & 0 & 0 & 0 & 0 & 1 & 2 & 1 \end{bmatrix} \cdot \begin{bmatrix} v_{k-7} \\ v_{k-6} \\ v_{k-5} \\ v_{k-4} \\ v_{k-3} \\ v_{k-2} \\ v_{k-1} \\ v_k \end{bmatrix} = \quad \text{Eq. (9)}$$

$$\begin{bmatrix} v_{k-5} + 2v_{k-6} + v_{k-7} \\ v_{k-4} + 2v_{k-5} + v_{k-6} \\ v_{k-3} + 2v_{k-4} + v_{k-5} \\ v_{k-2} + 2v_{k-3} + v_{k-4} \\ v_{k-1} + 2v_{k-2} + v_{k-3} \\ v_k + 2v_{k-1} + v_{k-2} \end{bmatrix}$$

$$V_k = \begin{bmatrix} v_{k-6} & 1 \\ v_{k-5} & 1 \\ v_{k-4} & 1 \\ v_{k-3} & 1 \\ v_{k-2} & 1 \\ v_{k-1} & 1 \end{bmatrix} \quad \text{and} \quad \text{Eq. (10)}$$

$$(V_k^T V_k) = \begin{bmatrix} \sum_{n=k-1}^{k-6} (v_n)^2 & \sum_{n=k-1}^{k-6} v_n \\ \sum_{n=k-1}^{k-6} v_n & 1 \end{bmatrix} = \begin{bmatrix} SA & SB \\ SB & 1 \end{bmatrix} \quad \text{Eq. (11)}$$

The inverse of $(V_k^T V_k)$ is:

$$(V_k^T V_k)^{-1} = \frac{1}{SA - SB \cdot SB} \begin{bmatrix} 1 & -SB \\ -SB & SA \end{bmatrix} = \beta \cdot \begin{bmatrix} 1 & -SB \\ -SB & SA \end{bmatrix} \quad \text{Eq. (12)}$$

$$\beta = \frac{1}{SA - SB \cdot SB} \quad \text{And} \quad \text{Eq. (13)}$$

$$(V_k^T V''_k) = \begin{bmatrix} \sum_{n=k}^{k-5} (v_{n-1} \cdot v''_n) \\ \sum_{n=k}^{k-5} v''_n \end{bmatrix} = \begin{bmatrix} SC \\ SD \end{bmatrix} \quad \text{Eq. (14)}$$

To find $x_k$:

$$x_k = \beta(SC - SB \cdot SD) \quad \text{Eq. (15)}$$

or $$x_k = \frac{SC - SB \cdot SD}{SA - SB \cdot SB} \quad \text{Eq. (16)}$$

Knowing $x_k$, $$\cos^{-1}\left(\frac{x_k}{2} - 1\right)$$

can be found using a look-up table and the linear interpolation technique. Then the frequency can be found as $$f_k = \frac{1}{2\pi\Delta t} \cos^{-1}\left(\frac{x_k}{2} - 1\right) \quad \text{Eq. (17)}$$

While a digital implementation of the invention has been described, it will be apparent that the invention could also be implemented with analog circuits.

While specific embodiments of the invention have been describe in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Apparatus for on-line determination of the frequency of an ac signal in an ac electrical system comprising:
    sensing means coupled to the ac system generating a sensed signal representative of said ac signal;
    means generating a double average signal from said sensed signal; and
    means generating a frequency signal indicating the frequency of said ac signal from said double average signal.

2. The apparatus of claim 1 wherein said means generating said double average signal comprises means generating a running double average signal over a select period of time and wherein said means generating said frequency signal generates said frequency signal from said running double average signal.

3. The apparatus of claim 2 wherein said means generating said running double average signal comprises means generating a least means square value of said double average signal within a moving window of time.

4. The apparatus of claim 2 wherein said means generating said running double average signal comprises means generating an average of said double average signal within a moving window of time.

5. The apparatus of claim 1 wherein said sensing means digitally samples the amplitude of said ac signal to generate a digital amplitude signal, said means generating said double average signal comprises means generating a digital double average signal from said digital amplitudes signal, and said means generating said frequency signal generates a digital frequency signal from the digital double average signal.

6. The apparatus of claim 5 wherein said means generating said digital double average signal comprises means repetitively summing a value of a most recent digital sample generated by said sensing means, double a value of a next most recent digital sample, and a value of the third most recent digital sample.

7. The apparatus of claim 6 wherein said means generating said digital double average signal further includes means generating a running digital double average signal from a selected number of most recent values of said digital double average signal.

8. The apparatus of claim 7 wherein said means generating said running digital double average signal comprises means generating a least mean square running digital double average signal from said selected number of most recent values of said digital double average signal, and said means generating said frequency signal comprises means generating said frequency signal from said least means square running digital double average signal.

9. The apparatus of claim 8 wherein said sensing means senses voltage in said ac electrical system.

10. Apparatus providing protection to an ac electrical system comprising:

sensing means coupled to said ac electrical system and generating digital samples of a selected waveform in said ac electrical system;

digital processing means comprising:
means generating digital double average signal;
means generating a digital frequency signal from said digital double average signal; and
means comparing said digital frequency signal to selected limits; and output means generating an output when said digital frequency signal is not within said selected limits.

11. The apparatus of claim 10 wherein said means generating said digital double average signal comprises means repetitively summing a value of a most recent digital sample, double a value of a next most recent digital sample, and a value of a third most recent digital sample.

12. The apparatus of claim 11 wherein said means generating said digital double average signal further includes means generating a running digital double average signal from a selected number of most recent values of said digital double average signal.

13. The apparatus of claim 12 wherein said means generating said running digital double average signal, comprises means generating a least means square running digital double average signal from said selected number of most recent values of said digital double average signal, and said means generating said frequency signal comprises means generating said frequency signal from said least means square running digital double average signal.

14. The apparatus of claim 13 wherein said sensing means senses a phase voltage in said ac electrical system as said selected waveform.

15. The apparatus of claim 10 wherein said sensing means senses a phase voltage in said ac electrical system as said selected waveform.

* * * * *